United States Patent
Zhang (10) Patent No.: US 9,646,998 B2
(45) Date of Patent: May 9, 2017

(54) ARRAY SUBSTRATE AND MANUFACTURING METHOD THEREOF, AS WELL AS DISPLAY DEVICE

(71) Applicants: Boe Technology Group Co., Ltd., Beijing (CN); Ordos Yuansheng Optoelectronics Co., Ltd., Beijing (CN)

(72) Inventor: Jinzhong Zhang, Beijing (CN)

(73) Assignees: Boe Technology Group Co., Ltd., Beijing (CN); Ordos Yuansheng Optoelectronics Co., Ltd., Inner Mongolia (CN)

( * ) Notice: Subject to any disclaimer, the term of this patent is extended or adjusted under 35 U.S.C. 154(b) by 0 days.

(21) Appl. No.: 14/769,222

(22) PCT Filed: Dec. 1, 2014

(86) PCT No.: PCT/CN2014/092659
§ 371 (c)(1),
(2) Date: Aug. 20, 2015

(87) PCT Pub. No.: WO2016/033880
PCT Pub. Date: Mar. 10, 2016

(65) Prior Publication Data
US 2016/0247829 A1    Aug. 25, 2016

(30) Foreign Application Priority Data
Sep. 5, 2014    (CN) .......................... 2014 1 0453736

(51) Int. Cl.
*H01L 27/108*    (2006.01)
*H01L 29/94*    (2006.01)
(Continued)

(52) U.S. Cl.
CPC .......... *H01L 27/1225* (2013.01); *H01L 21/77* (2013.01); *H01L 27/12* (2013.01);
(Continued)

(58) Field of Classification Search
USPC ..... 257/295, 2, 425, 773, 421, 192, 27, 315, 257/368, 24, 321, 326, 335, 296,
(Continued)

(56) References Cited

U.S. PATENT DOCUMENTS 9,230,985 B1 * 1/2016 Wu .................... H01L 27/11582
2004/0238808 A1 * 12/2004 Fraboulet ............... B82Y 10/00
257/9
(Continued)

FOREIGN PATENT DOCUMENTS

CN    1750168    3/2006
CN    103165608    6/2013
(Continued)

OTHER PUBLICATIONS

Office Action from China Application No. 201410453736.4 dated Feb. 28, 2017.

*Primary Examiner* — Dao H Nguyen
*Assistant Examiner* — Tram H Nguyen
(74) *Attorney, Agent, or Firm* — Calfee, Halter & Griswold LLP (57) ABSTRACT

This disclosure provides an array substrate and manufacturing method thereof, as well as a display device, the array substrate comprising: a substrate and a pattern comprising a source and a drain located on the substrate, further comprising: a tunnel junction structure located between the substrate and the pattern comprising the source and the drain, the tunnel junction structure forming an active layer of the array substrate and resulting in tunneling effect. The above array substrate and the manufacturing method thereof, as well as
(Continued)

the display device have one or more beneficial effects as follows: a relatively high current carrier mobility, a higher switching speed of TFT; the threshold voltage of the TFT is not easily drifted, and has a relatively high uniformity; each pixel can use less TFTs, the switching speed of the pixel is higher; and the fabricating process is simpler and more practicable.

20 Claims, 6 Drawing Sheets

(51) Int. Cl.
    *H01L 27/12*     (2006.01)
    *H01L 21/77*     (2017.01)
    *H01L 27/22*     (2006.01)
    *H01L 43/02*     (2006.01)
    *H01L 43/10*     (2006.01)
    *H01L 43/12*     (2006.01)

(52) U.S. Cl.
    CPC ........ *H01L 27/127* (2013.01); *H01L 27/1255* (2013.01); *H01L 27/22* (2013.01); *H01L 43/02* (2013.01); *H01L 43/10* (2013.01); *H01L 43/12* (2013.01)

(58) Field of Classification Search
    USPC ....... 257/252–254, 257–258, 57, 59, 72, 83,
        257/290, 351, 392, 223, 227, 291, 292,
        257/439, 443, 655, E27.1, E27.125,
        257/E27.112, E29.117, E29.145, E29.147,
        257/E29.151, E29.273–E29.299, E29.314,
        257/E29.32, E23.016; 438/3; 365/145,
        365/185.28
    See application file for complete search history.

(56) References Cited

U.S. PATENT DOCUMENTS

| | | | |
|---|---|---|---|
| 2006/0118839 A1* | 6/2006 | Sugahara | B82Y 10/00 257/295 |
| 2012/0299635 A1 | 11/2012 | Worledge et al. | |
| 2013/0056709 A1* | 3/2013 | Kim | H01L 27/14609 257/30 |

FOREIGN PATENT DOCUMENTS

| | | |
|---|---|---|
| CN | 103165808 | 6/2013 |
| CN | 103811045 | 5/2014 |
| JP | 2009265561 | 11/2009 |

\* cited by examiner

ARRAY SUBSTRATE AND MANUFACTURING METHOD THEREOF, AS WELL AS DISPLAY DEVICE

RELATED APPLICATIONS

The present application is the U.S. national phase entry of PCT/CN2014/092659, filed Dec. 1, 2014, which claims the benefit of Chinese Patent Application No. 201410453736.4, filed Sep. 5, 2014, the entire disclosures of which are incorporated herein by reference.

FIELD OF THE INVENTION

This disclosure relates to the field of display technology, particularly to an array substrate and a manufacturing method thereof, as well as a display device.

BACKGROUND OF THE INVENTION

With the continuous development of the display technology, the organic light-emitting diode (OLED) display device as a new panel display device will inevitably become the developing trend of the display device of next generation by virtue of its advantages of light volume, high contrast, high color gamut, low power consumption, and flexible display.

According to the difference in the driving mode, the OLED display device can be divided into: Passive Matrix Organic Light Emission Display (PMOLED) and Active Matrix Organic Light Emission Display (AMOLED). Relative to the PMOLED, the AMOLED has a higher response speed, and can meet the requirements of display devices in various sizes, hence, many enterprises pay more attention to the AMOLED.

In the prior art, according to the difference in the forming material of the thin film transistor (TFT) active layer, the AMOLED array substrate mainly includes a low temperature polysilicon array substrate and an oxide array substrate. For the low temperature polysilicon array substrate, when the low temperature polysilicon after crystallization is in grain state, there is certain gap between the grains, such that the threshold voltage of the TFT can easily drift, and the uniformity of the array substrate is relatively bad. In order to improve uniformity of the array substrate, the drift of the threshold voltage may be eliminated by arranging a plurality of TFTs. However, the increase of the TFT amount will in turn result in slow-down of the switching speed of the pixel, and result in complexity of the fabricating process of the array substrate. Moreover, the low temperature polysilicon requires a relatively high temperature in crystallization, which will also increase complexity of the fabricating process. For the oxide array substrate, since the current carrier mobility in the electrified oxide is relatively low, it cannot fulfill the characteristic of the OLED as a current device that needs support of a relatively high current carrier mobility better, thereby resulting in a relatively low switching speed of the TFT.

SUMMARY OF THE INVENTION

This disclosure provides an array substrate and a manufacturing method thereof, as well as a display device, so as to achieve the aim of mitigating or eliminating at least one of the above technical problems.

Therefore, the present invention adopts the following technical solutions:

An array substrate comprising: a substrate and a pattern comprising a source and a drain located on the substrate, further comprising: a tunnel junction structure located between the substrate and the pattern comprising the source and the drain, the tunnel junction structure forming an active layer of the substrate and resulting in tunneling effect.

In some embodiments, the tunnel junction structure may comprise: a first magnetic layer, an insulating layer, and a second magnetic layer laminated successively, the first magnetic layer and the second magnetic layer are both in film modalities of high compactness.

The first magnetic layer may comprise an anti-ferromagnetic pinning layer and a ferromagnetic pinned layer laminated successively.

The material of the anti-ferromagnetic pinning layer may comprise at least one of IrMn, NiMn, NiO, FeMn and $L_2BaNiO_5$.

The material of the ferromagnetic pinned layer may comprise at least one of CoFe, Co, Fe, NiFe and NiCo.

The material of the insulating layer may comprise at least one of MgO, $Al_2O_3$ and Ti2O3.

In some embodiments, the thickness of the insulating layer may be less than 10 nm.

In some embodiments, the material of the second magnetic layer may be a soft magnetic material, and the soft magnetic material may comprise at least one of CoFe, Co, Fe, NiFe and NiCo.

In some embodiments, the array substrate may comprise a plurality of pixels, each of the pixels may comprise two thin film transistors and one storage capacitance.

The present invention further provides a method of fabricating an array substrate proposed according to the embodiment the present invention, comprising: forming a pattern comprising a source and a drain on the substrate, and prior to the step of forming a pattern comprising a source and a drain, forming a pattern comprising a tunnel junction structure on the substrate, wherein the tunnel junction structure forms an active layer of the substrate and results in tunneling effect.

In some embodiments, the method may further comprise: laminating a first magnetic layer, an insulating layer, and a second magnetic layer successively to form the tunnel junction structure, wherein the first magnetic layer and the second magnetic layer are both in film modalities of high compactness.

The step of forming a pattern comprising a tunnel junction structure on the substrate may comprise: covering the substrate with materials of the first magnetic layer, the insulating layer, and the second magnetic layer successively using chemical vapor deposition process or sputtering process, and forming the pattern comprising the tunnel junction structure using patterning process.

This disclosure further provides a display device comprising an array substrate according to the embodiment of the present invention.

In the array substrate and the manufacturing method thereof, as well as the display device provided by this disclosure, the TFT of the array substrate has a tunnel junction structure. When the gate of the TFT is applied with a driving voltage, the magnetic moment directions of the two magnetic layers of the tunnel junction structure are the same, the TFT is in a spin electron tunneling state, and the TFT is turned on. When the gate of the TFT is not applied with a driving voltage, the magnetic moment directions of the two magnetic layers of the tunnel junction structure are opposite, the TFT is in a spin electron shielding state, and the TFT is turned off, thereby realizing the switching function of the TFT. Since in the working process of the TFT, the tunnel junction structure thereof makes use of the tunneling effect to realize resistance difference, the current direction in the tunnel junction structure is always perpendicular to the film plane. Hence, the current carrier of the array substrate provided by the present invention has a relatively high mobility, thereby the switching speed of the TFT is relatively high.

Moreover, since the two magnetic layers constituting the tunnel junction structure are both in film modalities of high compactness, rather than presence in grain state with relatively large gaps, the threshold voltage of the TFT comprising the tunnel junction structure in this disclosure cannot be easily drifted, and the array substrate has a better uniformity than the prior art.

On the other hand, since the array substrate in this disclosure has a better uniformity, it is unnecessary to improve the uniformity of the array substrate by arranging a plurality of TFTs like the prior art, and the array substrate in this disclosure can use less TFTs, thus increasing the switching speed of the pixel.

In addition, since the high temperature crystallization process is not required to form the tunnel junction structure, it can be deposited at a relatively low temperature. Moreover, the number of TFTs required by the array substrate with the tunnel junction structure is reduced, thus simplifying the fabricating process of the array substrate.

BRIEF DESCRIPTION OF DRAWINGS

In order to explain the technical solutions in the embodiments of the present invention or the prior art more clearly, next, the drawings to be used in the description of the embodiments or the prior art will be introduced briefly. The drawings described below are only some embodiments of the present invention, for the skilled person in the art, other drawings can also be obtained based on these drawings on the premise of not paying any creative work.

DETAILED DESCRIPTION

Next, the technical solutions in the embodiments of the present invention will be described clearly and completely in combination with the drawings in the embodiments of the present invention. As is apparent, the embodiments described are only a part rather than all of the embodiments of the present invention. Based on the embodiments in the present invention, all other embodiments obtained by the ordinary skilled person in the art without undue experimentation belong to the protection scope of this disclosure.

This embodiment provides an array substrate, the array substrate comprising: a substrate and a pattern comprising a source and a drain located on the substrate, the substrate further comprising: a tunnel junction structure located between the substrate and the pattern comprising the source and the drain, the tunnel junction structure forming an active layer of the array substrate and resulting in tunneling effect.

Figure 8:
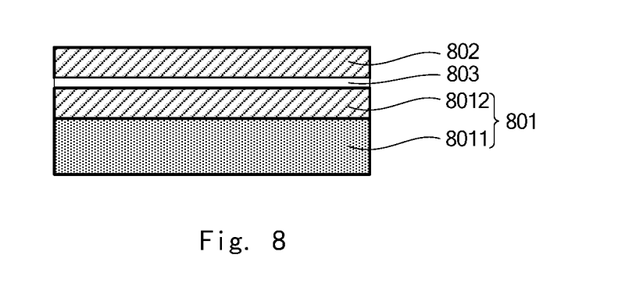
FIG. 8 is a sectional view of a tunnel junction structure provided by the embodiment of the present invention.

As shown in FIG. 8, the tunnel junction structure comprises: a first magnetic layer 801, an insulating layer 803 and a second magnetic layer 802 laminated successively, the first magnetic layer 801 and the second magnetic layer 802 are both in film modalities of high compactness.

Figure 9:
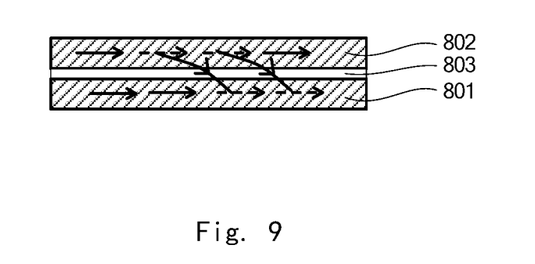
FIG. 9 is a sectional view of a tunnel junction structure provided by the embodiment of the present invention in a spin electron tunneling state.

The array substrate comprises a plurality of TFT arranged in matrix, with said tunnel junction structure forming the active layer of the TFT. The control principle of the TFT comprising the tunnel junction structure provided by this embodiment is as follows:

As shown in FIG. 9, when the gate of the TFT is applied with a driving voltage, the first magnetic layer 801 and the second magnetic layer 802 of the tunnel junction structure located at two sides of the insulating layer 803 are magnetized. The magnetic moment directions of the two magnetic layers are the same, hence, the electron spin directions inside the two magnetic layers are the same. Here, the insulating layer 803 generates a relatively low potential barrier for electrons in the same spin direction, and the tunneling probability of the electron is large. The electrons of a majority of spin subbands in the second magnetic layer 802 will pass through the potential barrier generated by the insulating layer 803 to enter the vacant state of a majority of subbands of the first magnetic layer 801. Meanwhile, the electrons of a minority of spin subbands also enter the vacant state of a minority of subbands of the second magnetic layer 802 from the first magnetic layer 801, thereby the TFT is in the spin electron tunneling state and the TFT is turned on.

Figure 10:
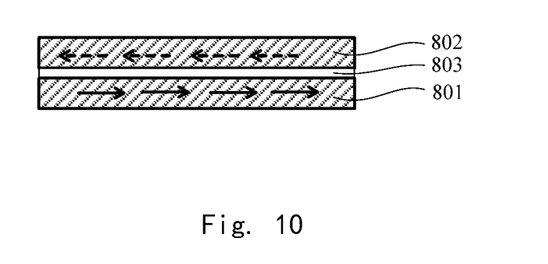
FIG. 10 is a sectional view of a tunnel junction structure provided by the embodiment of the present invention in a spin electron shielding state.

As shown in FIG. 10, when the gate of the TFT is not applied with a driving voltage, the magnetic moment directions of the first magnetic layer 801 and the second magnetic layer 802 of the tunnel junction structure located at two sides of the insulating layer 803 are opposite. Hence, the spin direction of the electrons of a majority of spin subbands in the first magnetic layer 801 and the spin direction of electrons of a minority of spin subbands in the second magnetic layer 802 are opposite and parallel. Here, the insulating layer 803 generates a relatively high potential barrier for the electrons in an opposite spin direction, and the tunneling probability of the electrons is minimal. The electrons of a majority of spin subbands in the first magnetic layer 801 will enter the vacant state of a minority of subbands of the second magnetic layer 802. Meanwhile, the electrons of a minority of spin subbands also enter the vacant state of a majority of subbands of the second magnetic layer 802 from the first magnetic layer 801. In this case, the TFT is in the spin electron shielding state, and the TFT is turned off.

The switching function of the TFT is realized by the above process. From the above process it can be seen that in the working process of the TFT, the tunnel junction structure of the TFT makes use of the tunneling effect to realize resistance difference, and the current direction in the tunnel junction structure is always perpendicular to the film plane. Hence, the current carrier of the array substrate provided by this embodiment has a relatively high mobility, and the switching speed of the TFT is relatively high.

Moreover, since the two magnetic layers constituting the tunnel junction structure are both in film modalities of high compactness, rather than presence in grain state with relatively large gaps, the threshold voltage of the TFT comprising the tunnel junction structure in this embodiment cannot be easily drifted, and the array substrate has a better uniformity than the prior art.

On the other hand, since the array substrate in this embodiment has a better uniformity, it is unnecessary to improve the uniformity of the array substrate by arranging a plurality of TFTs as shown in the prior art. The array substrate in this embodiment uses less TFTs, thus increasing the switching speed of the pixel.

In addition, since the high temperature crystallization process is not required to form the tunnel junction structure and can be deposited at a relatively low temperature, the number of TFTs required by the array substrate with the tunnel junction structure is reduced, thus simplifying the fabricating process of the array substrate.

In some embodiments, the first magnetic layer 801 of the above tunnel junction structure may comprise an anti-ferromagnetic pinning layer 8011 and a ferromagnetic pinned layer 8012 laminated successively. The material of the anti-ferromagnetic pinning layer 8011 may comprise anti-ferromagnetic material, synthetic anti-ferromagnetic material, or mixed anti-ferromagnetic material, etc. In particular, it may comprise at least one of IrMn, NiMn, NiO, FeMn and $L_2BaNiO_5$. The material of the ferromagnetic pinned layer 8012 may be a soft magnetic material, and particularly may comprise at least one of CoFe, Co, Fe, NiFe and NiCo, so as to ensure that the threshold voltage of the TFT is not easily drifted and the array substrate has a better uniformity.

The material of the insulating layer 803 may comprise at least one of MgO, Al2O3 and Ti2O3. In addition, the thickness of the insulating layer 803 may be set relatively small, which may be less than 10 nm, so as to ensure that the electrons can pass through the insulating layer 803 quickly and tunneling effect occurs to the tunnel junction structure rapidly.

The material of the second magnetic layer 802 is generally soft magnetic material, which may comprise at least one of CoFe, Co, Fe, NiFe and NiCo. The soft magnetic material is selected so as to ensure that the threshold voltage of the TFT is not easily drifted, and the array substrate has a better uniformity.

It should be noted that since the electron tunneling probability and the ferromagnetic barrier height are in exponential decay relationship, spin polarization will also be generated even if incident electron flow with a spin polarization rate of zero passes through the ferromagnetic barrier, so as to enable the electrons to tunnel through the insulating layer. Hence, the tunneling effect can occur as long as one of the two magnetic layers of the ferromagnetic tunnel junction structure has ferromagnetism, thereby enabling the materials of the first magnetic layer 801 and the second magnetic layer 802 of the tunnel junction structure to have a larger selection range.

Since the TFT of the array substrate provided by this embodiment has a tunnel junction structure, the threshold voltage of the TFT is not easily drifted, and the array substrate has a good uniformity. Hence, it is unnecessary to arrange a plurality of TFTs to improve uniformity of the array substrate. The array substrate in this embodiment may comprise a plurality of pixels, and each pixel may comprise two TFTs and one storage capacitance.

Figure 7:
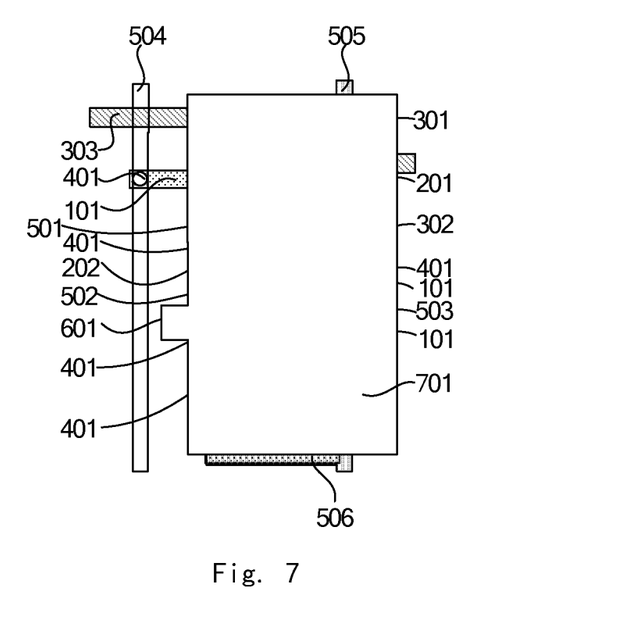

Specifically, the pixel structure of the array substrate provided by this embodiment may be as shown in FIG. 7, comprising: a buffer layer 101 located on the substrate, wherein the buffer layer 101 is a conductive film; a pattern comprising a first tunnel junction structure 201 and a second tunnel junction structure 202 formed on the buffer layer 101; a gate insulating layer (not shown in the figure) covering the pattern comprising the first tunnel junction structure 201 and the second tunnel junction structure 202; a pattern comprising a first gate 301, a second gate 302, and a gate line 303 formed on the gate insulating layer; an interlayer dielectric layer (not shown in the figure) covering the pattern comprising the first gate 301, the second gate 302 and the gate line 303, a plurality of interlayer dielectric layer via holes 401 within the interlayer dielectric layer; a pattern comprising a first drain 501, a second drain 502, a crossover 503, a data line 504 and a VDD line 505 formed on the interlayer dielectric layer, wherein the first drain 501 is electrically connected with the second gate 302 through the interlayer dielectric layer via hole 401, the crossover 503 is used for electrically connecting the second gate 302 and the buffer layer 101, the data line 504 and the VDD line 505 are electrically connected with the buffer layer 101 through the interlayer dielectric layer via holes 401 respectively, the first tunnel junction structure 201, the first gate 301 and the first drain 501 belong to control switches, the second tunnel junction structure 202, the second gate 302 and the second drain 502 belong to driving switches, the buffer layer 101 actually is used as the source regions of the control switch and the drive switch; the pattern comprising the first drain 501, the second drain 502, the crossover 503, the data line 504 and the VDD line 505 and the buffer layer 101 constitute a storage capacitance 506; a flat layer (not shown in the figure) covering the pattern comprising the first drain 501, the second drain 502, the crossover 503, the data line 504 and the VDD line 505, the plat layer having a plat layer via hole 601; a pattern comprising a cathode 701 formed on the flat layer, the cathode 701 being electrically connected with the second drain 502 through the flat layer via hole 601.

Figure 11:
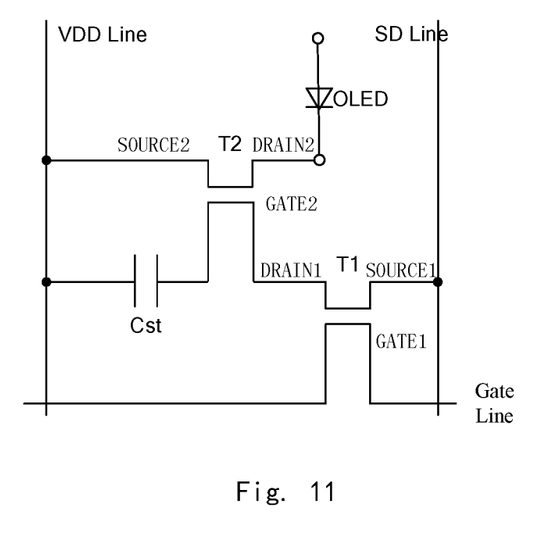
FIG. 11 is a circuit diagram of an array substrate provided by the embodiment of the present invention.

The equivalent circuit diagram of the above pixel structure may be as shown in FIG. 11. When the pixel needs to be displayed, the gate line (i.e., the Gate line) applies a driving signal to the gate of the control switch T1, so as to turn on the control switch T1 and generate a transverse magnetic field within the control switch T1. The transverse magnetic field influences the magnetic moment direction of the second magnetic layer of the tunnel junction structure in the control switch T1, such that the magnetic moment direction of the second magnetic layer is opposite to the magnetic moment direction of the first magnetic layer, thereby the control switch T1 works in the spin electron shielding state; i.e., the control switch T1 is turned off. Here, only few current passes through the gate of the driving switch T2, the transverse magnetic field generated by the gate of the driving switch T2 is insufficient to change the magnetic moment direction of the second magnetic layer of the tunnel junction structure in the driving switch T2, thereby the driving switch T2 works in the spin electron tunneling state, i.e., the driving switch T2 is turned on, here, a bias voltage is applied to the source of the driving switch T2 through the VDD line, the drain of the driving switch T2 outputs a signal to the OLED, to form pixel display.

When the pixel does not need to be displayed, the gate line enables the control switch T1 to be turned off, the magnetic moment direction of the second magnetic layer of the tunnel junction structure in the control switch T1 is same as the magnetic moment direction of the first magnetic layer. In this case, the control switch T1 works in the spin electron tunneling state; i.e., the control switch T1 is turned on. Here, the current in the data line (i.e., the SD line) passes through the control switch T1, and there are large amount of currents passing through the gate of the driving switch T2. The transverse magnetic field generated by the gate of the driving switch T2 is sufficient to change the magnetic moment direction of the second magnetic layer of the tunnel junction structure in the driving switch T2, thereby enabling the driving switch T2 to work in the spin electron shielding state, i.e., the driving switch T2 is turned off. Here, the current on the VDD line cannot pass through, i.e., the drain of the driving switch T2 cannot output a signal to the OLED, and the pixel is not displayed.

In another embodiment of the present invention, a method of fabricating an array substrate proposed according to the above embodiment is provided, comprising: forming a pattern comprising a source and a drain on the substrate, prior to the step of forming a pattern comprising a source and a drain, forming a pattern comprising a tunnel junction structure on the substrate, the tunnel junction structure forming an active layer of the array substrate and resulting in tunneling effect.

In this embodiment, a first magnetic layer, an insulating layer and a second magnetic layer are laminated successively to form a tunnel junction structure, the first magnetic layer 801 and the second magnetic layer 802 are both in film modalities of high compactness.

In the method of fabricating an array substrate provided by this embodiment, on the one hand, the forming material of the tunnel junction structure determines that the high temperature crystallization process is not required for forming the tunnel junction structure, and it can be deposited at a relatively low temperature. On the other hand, the film modality of the tunnel junction structure determines that the threshold voltage of the TFT is not easily drifted, the array substrate has a better uniformity, and it is unnecessary to arrange a plurality of TFTs to improve uniformity of the array substrate as in the prior art. Hence, the number of the required TFTs can be reduced, the two aspects both simplify the fabricating process of the array substrate.

Figure 1:
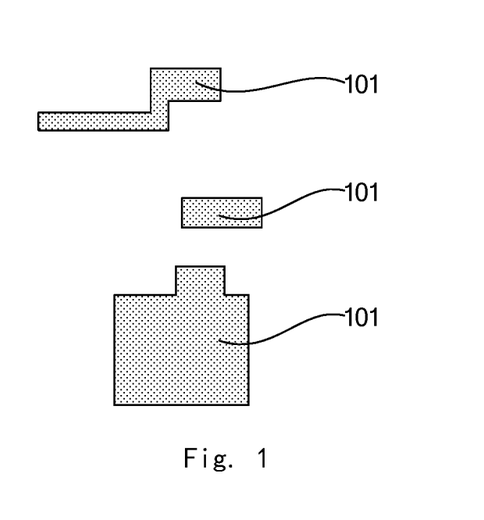
FIG. 1 to FIG. 7 are diagrams of respective steps of the fabricating method of an array substrate provided by the embodiment of the present invention.

Next, taking the pixel structure in which each pixel comprises two TFTs and one storage capacitance as the example, the fabricating method of the array substrate provided by this embodiment will be introduced specifically, as shown in FIG. 1 to FIG. 7, the fabricating method comprises:

Step S1: forming a pattern comprising a buffer layer 101 on the substrate, as shown in FIG. 1. In this step, the process of forming the buffer layer 101 may comprise: depositing a buffer layer material on the substrate firstly, depositing the buffer layer material may use the magnetron sputtering deposition method, the buffer layer material may comprise transparent conductive materials such as indium tin oxide or indium zinc oxide, the thickness may be 100 nm-200 nm; then removing part of the buffer layer material using patterning process, forming a pattern comprising the buffer layer 101, the removing process may use the wet etching process. This embodiment does not define the thickness of the substrate specifically, and the substrate with a thickness of 0.4 mm to 0.7 mm can be selected.

Figure 2:
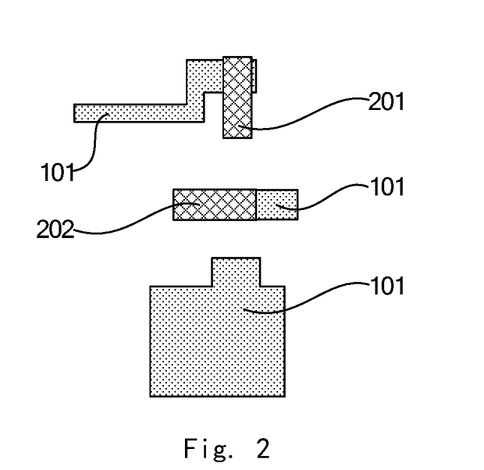

Step S2: forming a pattern comprising a tunnel junction structure on the substrate via step 1, as shown in FIG. 2. The above step S2 may comprise: covering the substrate with materials of the first magnetic layer, the insulating layer and the second magnetic layer successively using chemical vapor deposition process or sputtering process, forming the pattern comprising the tunnel junction structure using patterning process. The chemical vapor deposition process used by the coverage with the materials of the first magnetic layer, the insulating layer and the second magnetic layer may be plasma enhanced chemical vapor deposition process specifically, the sputtering process used may be radio frequency magnetron sputtering process.

The step of forming a pattern comprising a tunnel junction structure using patterning process specifically may be: forming a photoresist layer with a pattern of a first tunnel junction structure 201 and a second tunnel junction structure 202 on the substrate covered with the materials of the first magnetic layer, the insulating layer and the second magnetic layer, removing part of the materials of the first magnetic layer, the insulating layer and the second magnetic layer by taking the photoresist layer as the mask, keeping the material on the area where the first tunnel junction structure 201 and the second tunnel junction structure 202 are to be formed, forming the first tunnel junction structure 201 and the second tunnel junction structure 202. In the preceding process, removing part of the materials of the first magnetic layer, the insulating layer and the second magnetic layer may use the dry etching process.

Figure 3:
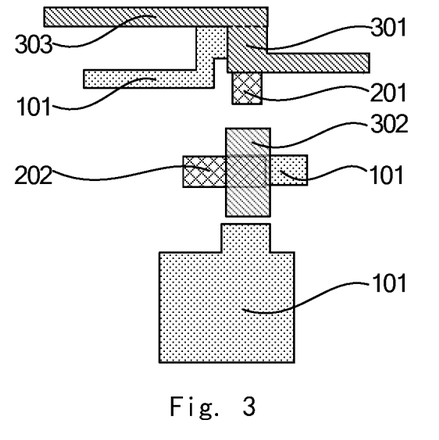

Step S3: forming a pattern comprising a first gate 301, a second gate 302 and a gate line 303 on the substrate via step 2, as shown in FIG. 3. In this step, the process of forming the first gate 301, the second gate 302 and the gate line 303 may comprise: deposing metal material, removing part of the metal material using patterning process, keeping the metal material on the area where the first gate 301, the second gate 302 and the gate line 303 are to be formed, forming a pattern comprising the first gate 301, the second gate 302 and the gate line 303. This embodiment does not define the forming material of the first gate 301, the second gate 302, and the gate line 303 specifically, which may comprise molybdenum, aluminum, argon, titanium and copper etc., so as to ensure that the first gate 301, the second gate 302, and the gate line 303 have good conductivity.

It should be noted that prior to forming the pattern comprising the first gate 301, the second gate 302, and the gate line 303, the method may further comprise: forming a gate insulating layer so as to enable the first tunnel junction structure 201 to be electrically insulated from the first gate 301, and the second tunnel junction structure 202 to be electrically insulated from the second gate 302. The forming material of the gate insulating layer in this embodiment may be an insulating material such as silicon dioxide or silicon nitride. In addition, the thickness of the gate insulating layer may be 300 nm to 400 nm, so as to ensure the insulating requirement between the tunnel junction structure and the gate.

Figure 4:
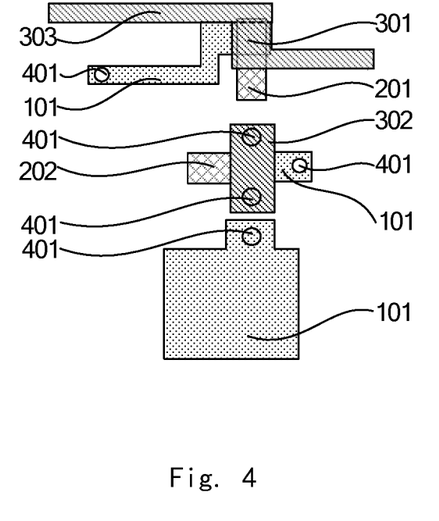

Step S4: covering the pattern comprising the first gate 301, the second gate 302, and the gate line 303 with an interlayer dielectric layer (not shown in the figure), forming a plurality of interlayer dielectric layer via holes 401 on the interlayer dielectric layer, as shown in FIG. 4.

In the above step, covering with the interlayer dielectric layer may utilize the plasma enhanced chemical vapor deposition process, and the forming material of the interlayer dielectric layer may be insulating materials such as silicon dioxide and silicon nitride, so as to enable the pattern comprising the first gate 301, the second gate 302, and the gate line 303 to be electrically insulated from the subsequently formed pattern comprising the first drain, the second drain, the crossover, the data line and the VDD line. Forming a plurality of interlayer dielectric layer via holes 401 may use the patterning process.

Figure 5:
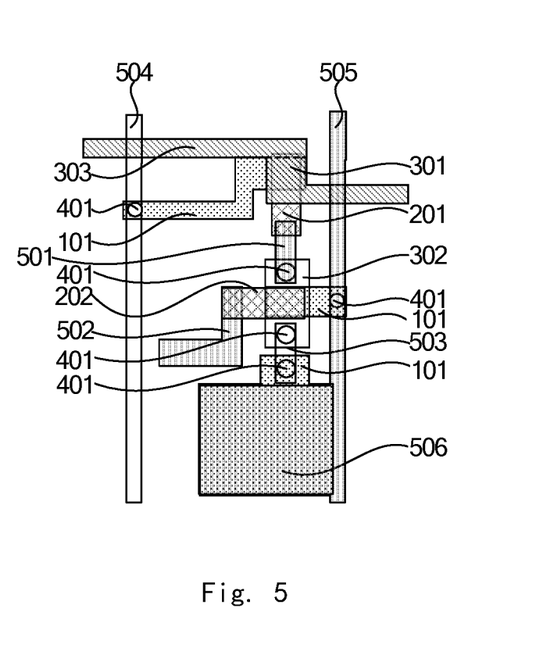

Step S5: forming a pattern comprising the first drain 501, the second drain 502, the crossover 503, the data line 504 and the VDD line 505 on the array substrate via step S4, as shown in FIG. 5. This step specifically may comprise: depositing the metal material using sputtering process, the deposited metal material may comprise molybdenum, titanium and aluminum etc., wherein, if titanium and aluminum are selected, the film structure formed by deposition may comprise a thin film formed by laminating titanium, aluminum and titanium successively; then removing part of the metal material using patterning process, keeping the metal material on the area where the first drain 501, the second drain 502, the crossover 503, the data line 504 and the VDD line 505 are to be formed, forming a pattern comprising the first drain 501, the second drain 502, the crossover 503, the data line 504 and the VDD line 505.

The first drain 501 is electrically connected with the second gate 302 through the interlayer dielectric layer via hole 401, the crossover 503 is used for electrically connecting the second gate 302 and the buffer layer 101, the data line 504, and the VDD line 505 are electrically connected with the buffer layer 101 through the interlayer dielectric layer via holes 401 respectively. The first tunnel junction structure 201, the first gate 301, and the first drain 501 belong to control switches, the second tunnel junction structure 202, the second gate 302, and the second drain 502 belong to driving switches, the pattern comprising the first drain 501, the second drain 502, the crossover 503, the data line 504, and the VDD line 505 and the buffer layer 101 constitute a storage capacitance 506, so as to prevent the leakage current from generating bad influence to the pixel display.

Figure 6:
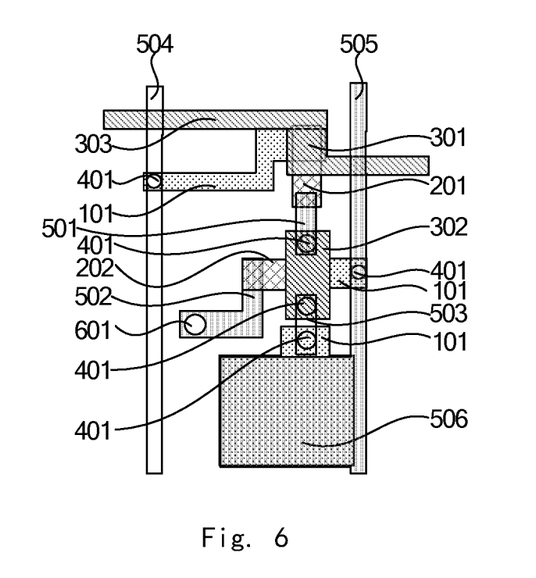

Step S6: forming a flat layer (not shown in the figure) on the array substrate via step S5, then forming a flat layer via hole 601 that penetrates the flat layer, as shown in FIG. 6. This step specifically may comprise: coating a resin material on the array substrate via step S5, forming a flat layer, the resin material may be photosensitive resin, and may also be non-photosensitive resin; then removing part of the resin material using patterning process, forming the flat layer via hole 601, the dry etching process may be used in the removing process.

Step S7: forming a pattern comprising a cathode 701 on the array substrate via step S6, as shown in FIG. 7. The above step may comprise: depositing a cathode material on the array substrate via step S6 using sputtering process, the cathode material may comprise metal materials such as magnesium and argentums, the thickness may be 10 nm to 30 nm; then removing part of the metal material using patterning process, keeping the metal material on the area where the cathode 701 is to be formed, forming a pattern comprising the cathode 701. Wherein, the cathode 701 is electrically connected with the second drain 502 through the flat layer via hole 601.

This embodiment may also coat insulating materials such as polyimide on the array substrate via step 7, then forming a pixel defining layer using patterning process.

It should be noted that the above step S1 to step S7 are fabricating methods with respect to the OLED display device, a skilled person in the art, on the basis of the technical solution that the TFT of the array substrate provided by this disclosure has a tunnel junction structure, can also apply the preceding technical solution into the fabrication of the array substrate of the liquid crystal display device. By changing the step S7 in the above step S1 to step S7 as forming a pattern comprising a pixel electrode, an array substrate with the same characteristics can be obtained.

In another embodiment of the present invention, a display device is provided, which comprises an array substrate provided by the preceding embodiment according to the present invention, since the current carrier of the array substrate of the display device has a relatively high mobility. The switching speed of the TFT is relatively high, hence, the display device in this embodiment has a relatively high switching speed. Moreover, since the comprised array substrate has a better uniformity, the image display of the display device in this embodiment has a better uniformity; in addition, since the tunnel junction structure of the array substrate can be deposited at a low temperature, the high temperature crystallization is not required, the number of TFTs required by each pixel structure is reduced. Hence, the fabricating process of the display device in this embodiment is simplified.

It should be noted that the display device in this embodiment may be any product or component with the display function such as a liquid crystal panel, electronic paper, an OLED panel, a mobile phone, a tablet computer, a television, a display, a lap top, a digital photo frame, a navigator.

What are stated above are only specific implementing modes of this disclosure. However, the protection scope of this disclosure is not limited to this, and any modifications or replacements that the skilled person familiar with the present technical field can easily think of within the technical scope disclosed by this disclosure should be covered within the protection scope of this disclosure. Therefore, the protection scope of this disclosure should be based on the protection scopes of the claims.

What is claimed is:

1. An array substrate comprising: a substrate and a pattern comprising a source and a drain located on the substrate, the substrate further comprising: a tunnel junction structure located between the substrate and the pattern comprising the source and the drain, the tunnel junction structure forming an active layer of the array substrate and resulting in tunneling effect.

2. The array substrate according to claim 1, wherein the tunnel junction structure comprises: a first magnetic layer, an insulating layer and a second magnetic layer laminated successively, and wherein the first magnetic layer and the second magnetic layer are both in film modalities of high compactness.

3. The array substrate according to claim 1, wherein the first magnetic layer comprises an anti-ferromagnetic pinning layer and a ferromagnetic pinned layer laminated successively.

4. The array substrate according to claim 3, wherein the material of the anti-ferromagnetic pinning layer comprises at least one of IrMn, NiMn, NiO, FeMn and $L_2BaNiO_5$.

5. The array substrate according to claim 3, wherein the material of the ferromagnetic pinned layer comprises at least one of CoFe, Co, Fe, NiFe and NiCo.

6. The array substrate according to claim 1, wherein the material of the insulating layer comprises at least one of MgO, $Al_2O_3$ and Ti2O3.

7. The array substrate according to claim 6, wherein the thickness of the insulating layer is less than 10 nm.

8. The array substrate according to claim 1, wherein the material of the second magnetic layer is soft magnetic material, and the soft magnetic material comprises at least one of CoFe, Co, Fe, NiFe and NiCo.

9. The array substrate according to claim 1, wherein the array substrate comprises a plurality of pixels, each of the pixels comprises two thin film transistors and one storage capacitance.

10. A method of fabricating an array substrate according to claim 1, comprising:
   forming a pattern comprising a source and a drain on the substrate,
   and prior to the step of forming a pattern comprising a source and a drain, forming a pattern comprising a tunnel junction structure on the substrate, wherein the tunnel junction structure forms an active layer of the array substrate and resulting in tunneling effect.

11. The method according to claim 10, comprising: laminating a first magnetic layer, an insulating layer and a second magnetic layer successively to form the tunnel junction structure, wherein the first magnetic layer and the second magnetic layer are both in film modalities of high compactness.

12. The method according to claim 10, the step of forming a pattern comprising a tunnel junction structure on the substrate comprising: covering the substrate with materials of the first magnetic layer, the insulating layer and the second magnetic layer successively using chemical vapor deposition process or sputtering process, and forming the pattern comprising the tunnel junction structure using patterning process.

13. The method according to claim 11, wherein the first magnetic layer comprises an anti-ferromagnetic pinning layer and a ferromagnetic pinned layer laminated successively.

14. The method according to claim 13, wherein the material of the anti-ferromagnetic pinning layer comprises at least one of IrMn, NiMn, NiO, FeMn and $L_2BaNiO_5$.

15. The method according to claim 13, wherein the material of the ferromagnetic pinned layer comprises at least one of CoFe, Co, Fe, NiFe and NiCo.

16. The method according to claim 11, wherein the material of the insulating layer comprises at least one of $MgO$, $Al_2O_3$ and $Ti2O3$.

17. The method according to claim 16, wherein the thickness of the insulating layer is less than 10 nm.

18. The method according to claim 11, wherein the material of the second magnetic layer is soft magnetic material, and the soft magnetic material comprises at least one of CoFe, Co, Fe, NiFe and NiCo.

19. The method according to claim 10, wherein the array substrate comprises a plurality of pixels, each of the pixels comprises two thin film transistors and one storage capacitance.

20. A display device comprising an array substrate according to claim 1.

* * * * *